US007123501B2

(12) United States Patent
Noda

(10) Patent No.: US 7,123,501 B2
(45) Date of Patent: Oct. 17, 2006

(54) SEMICONDUCTOR MEMORY DEVICE USING FERROELECTRIC CAPACITOR, AND SEMICONDUCTOR DEVICE WITH THE SAME

(75) Inventor: Junichiro Noda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 10/937,489

(22) Filed: Sep. 10, 2004

(65) Prior Publication Data

US 2005/0094476 A1 May 5, 2005

(30) Foreign Application Priority Data

Oct. 29, 2003 (JP) ............................. 2003-369288

(51) Int. Cl.
*G11C 11/22* (2006.01)
(52) U.S. Cl. ...................................... 365/145; 365/201
(58) Field of Classification Search ................ 365/145, 365/201, 149, 189.04
See application file for complete search history.

(56) References Cited

U.S. PATENT DOCUMENTS 6,061,266 A * 5/2000 Tan ............................. 365/145
6,321,360 B1 11/2001 Takeuchi et al.
6,459,608 B1 * 10/2002 Tamura ...................... 365/145
6,704,218 B1 * 3/2004 Rickes et al. ............... 365/145
6,934,175 B1 * 8/2005 Nishihara .................... 365/65

FOREIGN PATENT DOCUMENTS

JP      2002-175697      6/2002

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory device includes a memory cell section having at least one memory cell using a cell transistor and a ferroelectric capacitor to store data. A sense amplifier is connected to the memory cell through a bit line. The device further includes an error checking and correction circuit which checks and corrects an error of data, which is read out of the memory cell by the sense amplifier, through the bit line.

16 Claims, 15 Drawing Sheets

N : Number of data bits
P : Number of parity bits

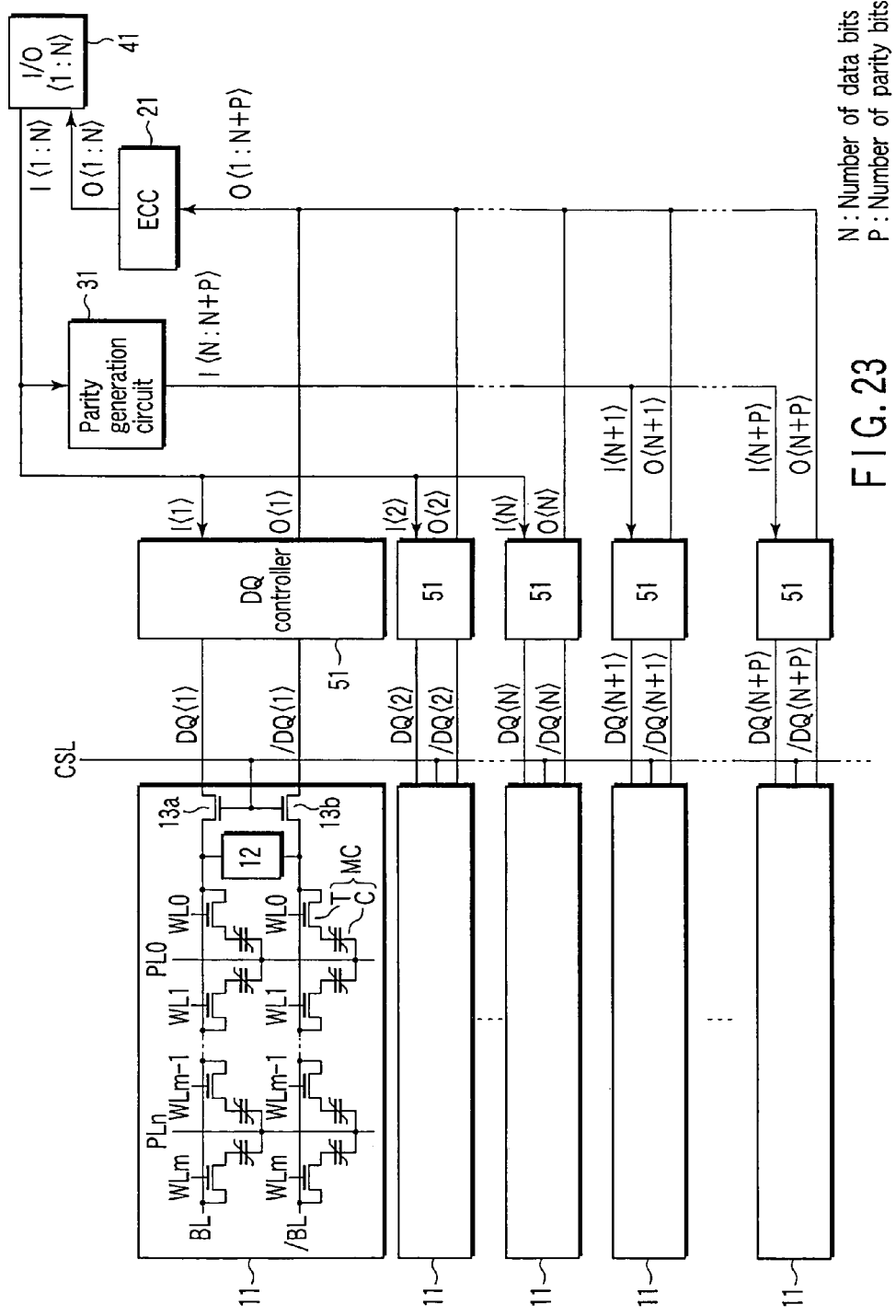
F I G. 23

SEMICONDUCTOR MEMORY DEVICE USING FERROELECTRIC CAPACITOR, AND SEMICONDUCTOR DEVICE WITH THE SAME

CROSS-REFERENCE TO RELATED APPLICATIONS

This application is based upon and claims the benefit of priority from prior Japanese Patent Application No. 2003-369288, filed Oct. 29, 2003, the entire contents of which are incorporated herein by reference.

BACKGROUND OF THE INVENTION

1. Field of the Invention

The present invention relates to a semiconductor memory device and a semiconductor device having the same. More specifically, the invention relates to a nonvolatile ferroelectric random access memory using a ferroelectric capacitor (referred to as a FeRAM hereinafter) and a FeRAM-embedded large-scale integrated circuit (referred to as an LSI hereinafter).

2. Description of the Related Art

Attention has recently been attracted to a FeRAM as a semiconductor memory device. Refer to Jpn. Pat. Appln. KOKAI Publication No. 2002-175697, for example.

FIG. 1 shows an example of a configuration (a 1T-1C configuration) of a memory cell MC of a FeRAM. Referring to FIG. 1, the memory cell MC includes a ferroelectric capacitor (C) 101 and a metal oxide semiconductor (MOS) transistor (T) 102 that are connected in series. More specifically, the gate, drain, and source of the MOS transistor 102 are connected to a word line WL, a bit line BL, and one electrode (upper electrode) of the ferroelectric capacitor 101, respectively. The other electrode (lower electrode) of the ferroelectric capacitor 101 is connected to a plate line PL.

The memory cell MC stores data using hysteresis properties of a ferroelectric, as shown in FIG. 2. When the voltage of the ferroelectric capacitor 101 is 0V, the remanent polarization (amount) P of the ferroelectric on the positive side represents "1" and that of the ferroelectric on the negative side represents "0." Thus, the memory cell MC stores data.

There follows an explanation of an operation of writing/reading data to/from the FeRAM. This operation is carried out by applying a given pulse to the plate line PL.

First, the principle of the FeRAM in write operation will be described using a memory cell MC having a 2T-2C configuration shown in FIG. 3. Basically, the same is true of the principle of a memory cell MC having a 1T-1C configuration shown in FIG. 1. FIG. 4 depicts a timing pulse that is generated in write operation.

In the 2T-2C memory cell MC shown in FIG. 3, remanent polarizations P whose directions are opposite to each other are written to ferroelectric capacitors 101a and 101b that are connected to paired bit lines BLa and BLb via MOS transistors 102a and 102b, respectively. For example, the potential of the bit line BLa is set at the ground level (0V) and that of the bit line BLb is set at 5V. If, in this case, the potential of the word line WL is 6V or higher (but the power supply voltage Vcc is 5V and the threshold voltage $V_{TH}$ of each of the transistors 102a and 102b is 1V), the potential of the upper electrode of the ferroelectric capacitor 101a is 0V and that of the upper electrode of the ferroelectric capacitor 101b is 5V.

After the word line WL is set at a high potential (high level), a pulse $P_W$ as shown in FIG. 4 is applied to the plate line PL. For example, 0V is applied to the plate line PL at timing $T_1$ (see FIG. 5B), 5V is applied thereto at timing $T_2$ (see FIG. 6B), and 0V is applied thereto at timing $T_3$ (see FIG. 7B). In FIGS. 5B, 6B and 7B, each of the arrows indicates the direction of remanent polarization P.

At timing $T_1$, the remanent polarization P of the ferroelectric capacitor 101a is located at a remanent polarization point A (FIG. 5A), and that of the ferroelectric capacitor 101b is located at a remanent polarization point D (FIG. 5C). At timing $T_2$, the remanent polarization P of the ferroelectric capacitor 101a moves from the remanent polarization point A to a remanent polarization point B (FIG. 6A), and that of the ferroelectric capacitor 101b moves from the remanent polarization point D to a remanent polarization point E (FIG. 6C). At timing $T_3$, the remanent polarization P of the ferroelectric capacitor 101a moves from the remanent polarization point B to a remanent polarization point C (FIG. 7A), and that of the ferroelectric capacitor 101b moves from the remanent polarization point E to the remanent polarization point D (FIG. 7C). Thus, the data write operation is completed. If this operation is defined as writing of data "0," writing of data "1" is defined as follows: the remanent polarization P located at the remanent polarization point D is written to the ferroelectric capacitor 101a, and the remanent polarization P located at the remanent polarization point C is written to the ferroelectric capacitor 101b.

Assume that power is shut down and the external electric field applied to the plate line PL and bit lines BLa and BLb becomes 0V. In this case, too, when data "0" is written, charges +Pr located at the remanent polarization point C are stored in the ferroelectric capacitor 101a, and charges -Pr located at the remanent polarization point E are stored in the ferroelectric capacitor 101b. Conversely, when data "1" is written, charges -Pr located at the remanent polarization point E are stored in the ferroelectric capacitor 101a, and charges +Pr located at the remanent polarization point C are stored in the ferroelectric capacitor 101b.

On the other hand, reading of data from the FeRAM is usually a destructive read. A rewrite operation is therefore required even in read operation and after all the read operation is almost the same as the write operation.

FIG. 8 illustrates a data read operation taking the above 2T-2C memory cell MC as an example. FIG. 9 shows a timing pulse generated in read operation.

In order to read data, as shown in FIG. 8, the potentials of the bit lines BLa and BLb are set at the ground level (0V) in the first precharge cycle. A sense amplifier (not shown) is separated from each of the bit lines BLa and BLb and. Under these conditions, the potential of the word line WL is set at 6V or higher. Thus, the potentials of the upper electrodes of the ferroelectric capacitors 101a and 101b both become 0V. In FIG. 8, the arrows indicate the directions of remanent polarizations P.

In read operation, a pulse $P_R$ as shown in FIG. 9 is applied to the plate line PL, as in the write operation described above. For example, 0V is applied to the plate line PL at timing $T_1$ (FIG. 10B), 5V is applied thereto at timing $T_2$ (FIG. 11B), and 0V is applied thereto at timing $T_3$ (FIG. 12B). In FIGS. 10B, 11B and 12B, the arrows indicate the directions of remanent polarizations P.

Assume that the remanent polarizations P as shown in FIGS. 10A and 10C are written to the ferroelectric capacitors 101a and 101b by writing data "0." More specifically, assume that the remanent polarization P of the ferroelectric capacitor 101a is written to the remanent polarization point C and that of the ferroelectric capacitor 101b is written to the remanent polarization point E at timing $T_1$. If data "0" is read in this case, the potential of the plate line PL changes from 0V to 5V at timing $T_2$. Thus, the remanent polarization P of the ferroelectric capacitor 101a moves from the remanent polarization point C to the remanent polarization point B (see FIG. 11A), and that of the ferroelectric capacitor 101b moves from the remanent polarization point E to the remanent polarization point B (see FIG. 11C). Data of the ferroelectric capacitor 101b, the direction of remanent polarization P of which is inverted, is destroyed temporarily.

If data "1" is read, the remanent polarization P of the ferroelectric capacitor 101a moves from the remanent polarization point E to the remanent polarization point B and that of the ferroelectric capacitor 101b moves from the remanent polarization point C to the remanent polarization point B at timing $T_2$. Data of the ferroelectric capacitor 101a, the direction of remanent polarization P of which is inverted, is destroyed temporarily.

The potential of the bit line connected to the ferroelectric capacitor the direction of remanent polarization P of which is inverted is slightly higher than that of the bit line connected to the ferroelectric capacitor the direction of remanent polarization P of which is not inverted. Data "0" or "1" can thus be read by sensing a difference in potential between the bit lines BLa and BLb. When data "0" is read, the potential of the bit line BLa becomes 0V and that of the bit line BLb becomes 5V. When data "1" is read, the potential of the bit line BLa becomes 5V and that of the bit line BLb becomes 0V.

The data that is destroyed by polarization inversion is rewritten to a memory cell MC within the same read cycle as the potential of the plate line PL changes from 5V to 0V. More specifically, when data "0" is read, the remanent polarization P of the ferroelectric capacitor 101a moves from the remanent polarization point B to the remanent polarization point C (FIG. 12A) and that of the ferroelectric capacitor 101b moves from the remanent polarization point C to the remanent polarization point D at timing $T_3$ (FIG. 12C). When data "1" is read, the remanent polarization P of the ferroelectric capacitor 101a moves from the remanent polarization point C to the remanent polarization point D and that of the ferroelectric capacitor 101b moves from the remanent polarization point B to the remanent polarization point C at timing $T_3$. The read operation is completed accordingly.

An FeRAM whose memory cells have a 1T-1C configuration requires a dummy cell that generates a reference potential to sense a small variation (potential difference) of bit lines or data "0" or "1."

FIG. 13 shows a basic configuration of a prior art FeRAM. In the FeRAM, a sense amplifier 111 reads data out of a cell area (array) 112. This data is rewritten to the cell area 112 in read operation as described above.

The FeRAM causes a so-called imprint phenomenon. The imprint phenomenon is as follows. If a cell is left unattended with data written thereto, its hysteresis properties are shifted to the positive or negative side of a voltage axis. The hysteresis properties of a cell are almost symmetric with respect to an intersection point between the voltage axis (V) and polarization axis (P) immediately after data is written to the cell. As shown in FIG. 14, however, the hysteresis properties of a cell that is left unattended with data "1" written thereto are shifted in the direction of the arrow (toward the negative side of the voltage axis), or from the position defined by broken lines to that defined by solid lines. Similarly, as shown in FIG. 15, the hysteresis properties of a cell that is left unattended with data "0" written thereto are shifted in the direction of the arrow (toward the positive side of the voltage axis), or from the position defined by broken lines to that defined by solid lines.

Though the above imprint phenomenon occurs, the amount of signal (the amount of polarization) does not vary so greatly when data of a memory cell that is left unattended (hereinafter referred to as unattended data) is read out as it is, as shown in FIGS. 16 and 17. No problems occur in this case. When data that is rewritten with remanent polarization P whose direction is the same as that of remanent polarization of the unattended data, or data that is rewritten by the same data as the unattended data is read out, no problems occur in particular. If, however, the memory cells that cause the imprint phenomenon increase in number, data cannot be read correctly.

If unattended data, which is rewritten by data whose remanent polarization P is opposite in direction to that of the unattended data, is read out, the amount of remanent polarization reduces more than that in the normal case where no imprint phenomenon occurs. In other words, as shown in FIG. 18, data "0" whose remanent polarization P is opposite in direction to that of unattended data (data "1") is written to a memory cell that is unattended with data "1" written thereto. Then, the amount of remanent polarization (black circle) of data "0" decreases more than that of the original remanent polarization (white circle) in the normal case by the shift of hysteresis properties. Thus, data "0" cannot be read correctly. Similarly, as shown in FIG. 19, data "1" whose remanent polarization P is opposite in direction to that of unattended data (data "0") is written to a memory cell that is unattended with data "0" written thereto. Then, the amount of remanent polarization (black circle) of data "1" is reduced more than the original remanent polarization amount (white circle) in the normal case by the shift of hysteresis properties. Thus, data "1" cannot be read correctly.

As described above, the prior art FeRAM has the problem in which data cannot be read correctly when the number of memory cells that cause an imprint phenomenon and when unattended data is rewritten by data whose remanent polarization P is opposite in direction to that of the unattended data.

BRIEF SUMMARY OF THE INVENTION

According to a first aspect of the present invention, there is provided a semiconductor memory device comprising a memory cell section having at least one memory cell using a cell transistor and a ferroelectric capacitor to store data, a sense amplifier being connected to the memory cell through a bit line, and an error checking and correction circuit which checks and corrects an error of data, which is read out of the memory cell by the sense amplifier, through the bit line.

According to a second aspect of the present invention, there is provided a semiconductor memory device comprising at least one memory cell section having a plurality of memory cells each using a cell transistor and a ferroelectric capacitor to store data, a sense amplifier being connected to the memory cells through a bit line, and an error checking and correction circuit which checks and corrects an error of arbitrary cell data, which is read out of the memory cells by the sense amplifier, through the bit line in accordance with parity data, wherein the sense amplifier rewrites the cell data, the error of which is corrected by the error checking and correction circuit, to the memory cells in read operation.

According to a third aspect of the present invention, there is provided a semiconductor device comprising a substrate on which a semiconductor memory device is mounted, a memory cell section provided on the substrate and configuring the semiconductor memory device, the memory cell section including at least one memory cell having a cell transistor and a ferroelectric capacitor to store data, a sense amplifier being connected to the memory cell through a bit line, an error checking and correction circuit provided on the substrate and configuring the semiconductor memory device, the error checking and correction circuit checking and correcting an error of cell data read out of the one memory cell by the sense amplifier, through the bit line, and a control circuit which controls the semiconductor memory device.

BRIEF DESCRIPTION OF THE SEVERAL VIEWS OF THE DRAWING

FIG. 23 is a block diagram of a FeRAM according to a second embodiment of the present invention.

DETAILED DESCRIPTION OF THE INVENTION

Embodiments of the present invention will be described with reference to the accompanying drawings.

[First Embodiment]

Figure 1:
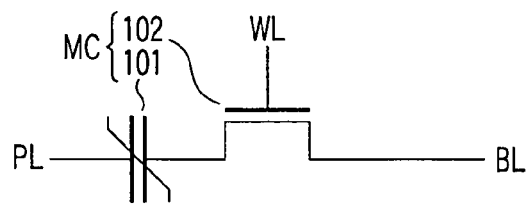
FIG. 1 is a diagram illustrating a memory cell of a prior art FeRAM and its problems.
Figure 2:
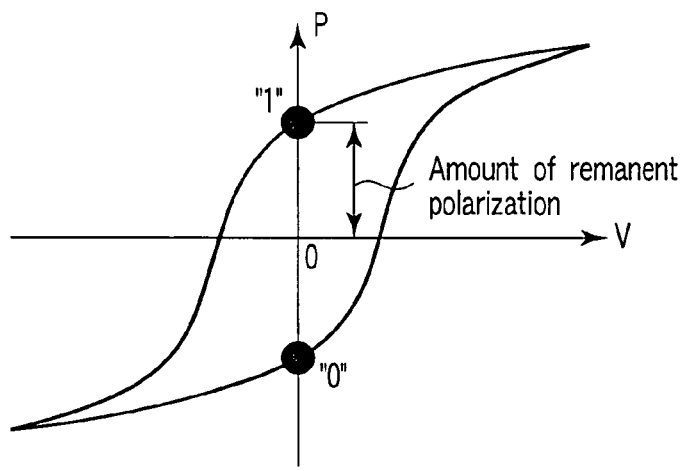
FIG. 2 is a graph of hysteresis properties of a ferroelectric.
Figure 3:
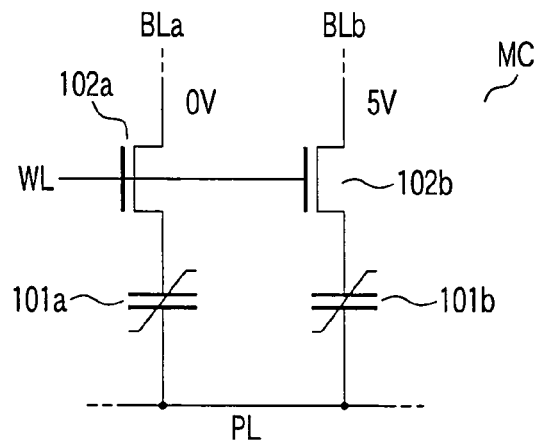
FIG. 3 is a diagram illustrating a data write operation taking a memory cell having a 2T-2C configuration as an example.
Figure 4:
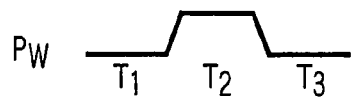
FIG. 4 is a waveform chart showing an example of a timing pulse in write operation.
Figure 5A:
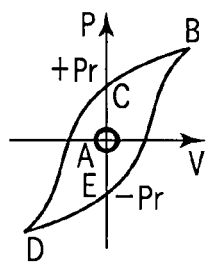
FIGS. 5A to 5C are diagrams illustrating a data write operation taking the memory cell shown in FIG. 3 as an example.
Figure 5B:
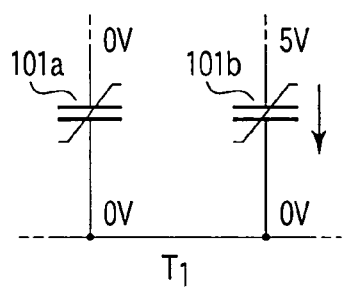
Figure 5C:
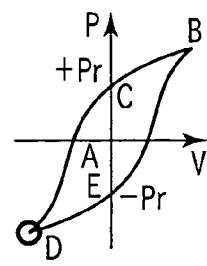
Figure 6A:
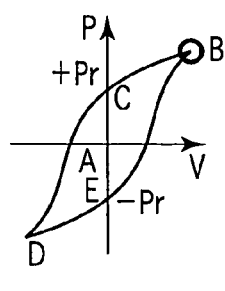
FIGS. 6A to 6C are diagrams illustrating a data write operation taking the memory cell shown in FIG. 3 as an example.
Figure 6B:
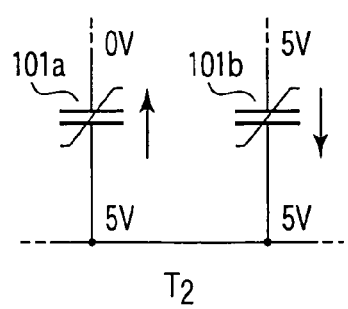
Figure 6C:
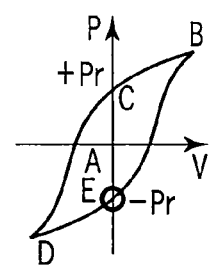
Figure 7A:
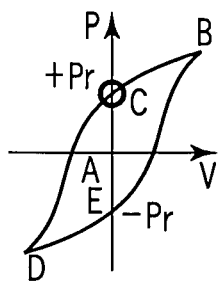
FIGS. 7A to 7C are diagrams illustrating a data write operation taking the memory cell shown in FIG. 3 as an example.
Figure 7B:
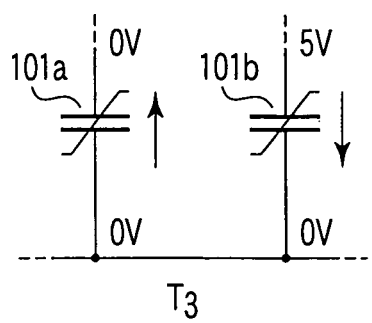
Figure 7C:
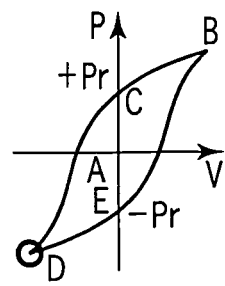
Figure 8:
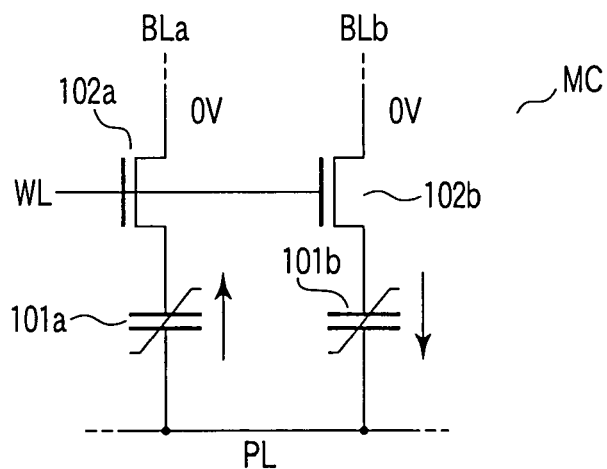
FIG. 8 is a diagram illustrating a data read operation taking a memory cell having a 2T-2C structure as an example.
Figure 9:
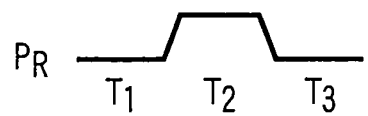
FIG. 9 is a waveform chart showing an example of a timing pulse in read operation.
Figure 10A:
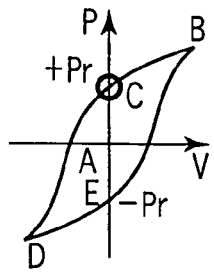
FIGS. 10A to 10C are diagrams illustrating a data read operation taking the memory cell shown in FIG. 8 as an example.
Figure 10B:
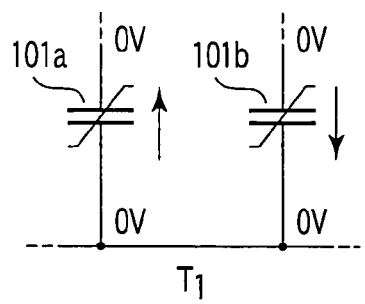
Figure 10C:
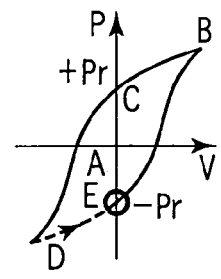
Figure 11A:
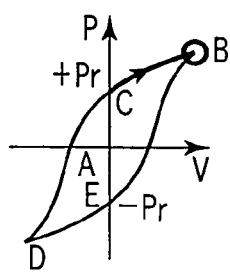
FIGS. 11A to 11C are diagrams illustrating a data read operation taking the memory cell shown in FIG. 8 as an example.
Figure 11B:
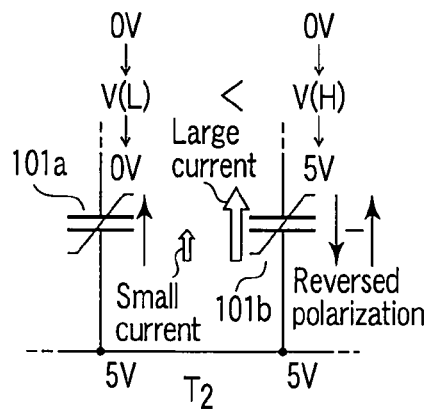
Figure 11C:
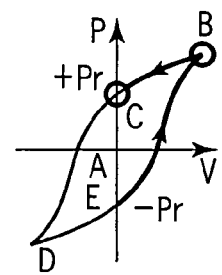
Figure 12A:
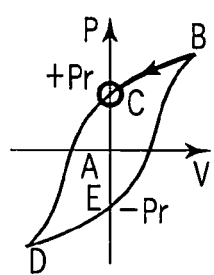
FIGS. 12A to 12C are diagrams illustrating a data read operation taking the memory cell shown in FIG. 8 as an example.
Figure 12B:
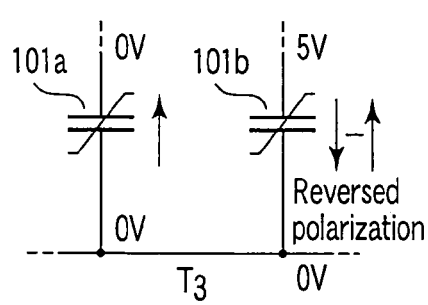
Figure 12C:
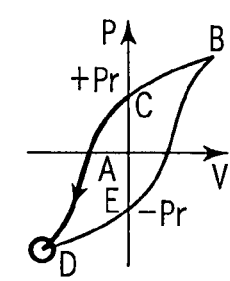
Figure 13:
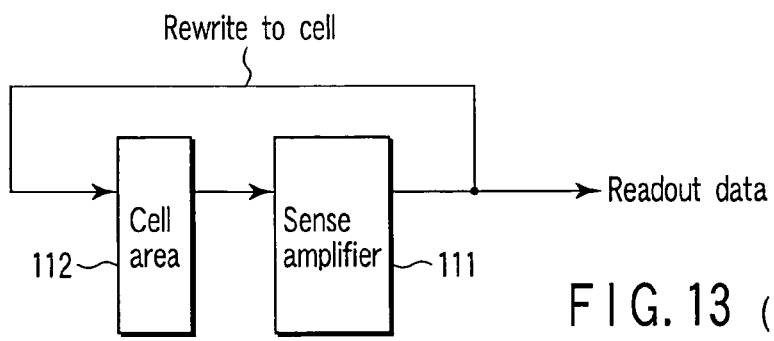
FIG. 13 is a block diagram showing a basic configuration of the prior art FeRAM.
Figure 14:
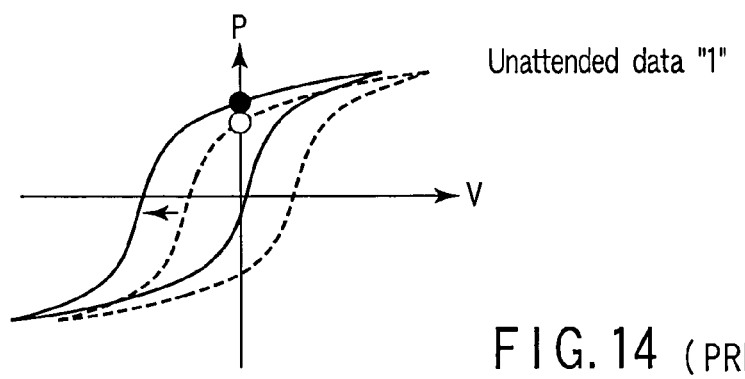
FIG. 14 is a graph illustrating an imprint phenomenon taking an unattended memory cell with data "1" written thereto as an example.
Figure 15:
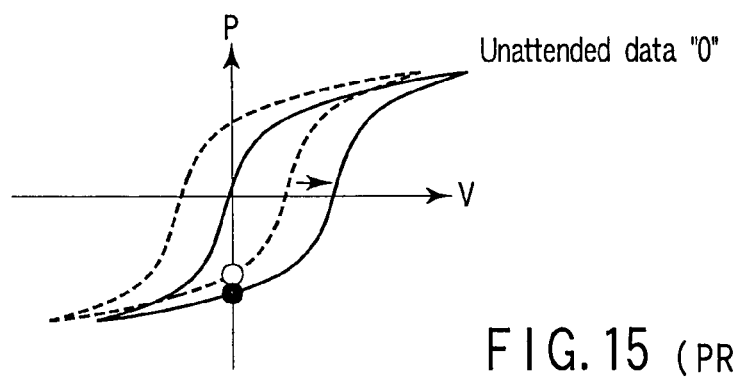
FIG. 15 is a graph illustrating an imprint phenomenon taking an unattended memory cell with data "0" written thereto as an example.
Figure 16:
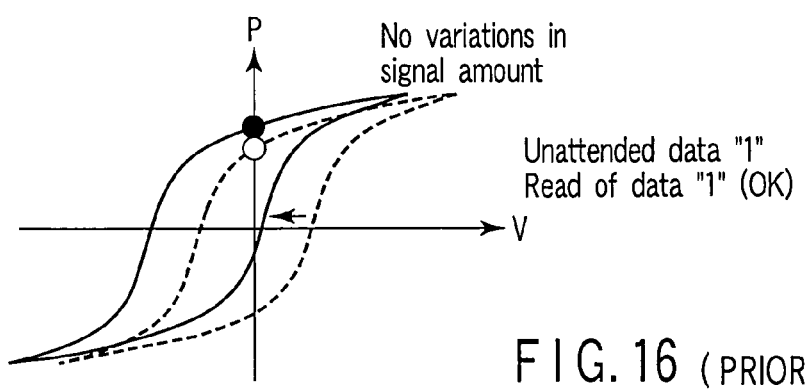
FIG. 16 is a graph illustrating variations of data amount of an unattended memory cell with data "1" written thereto.
Figure 17:
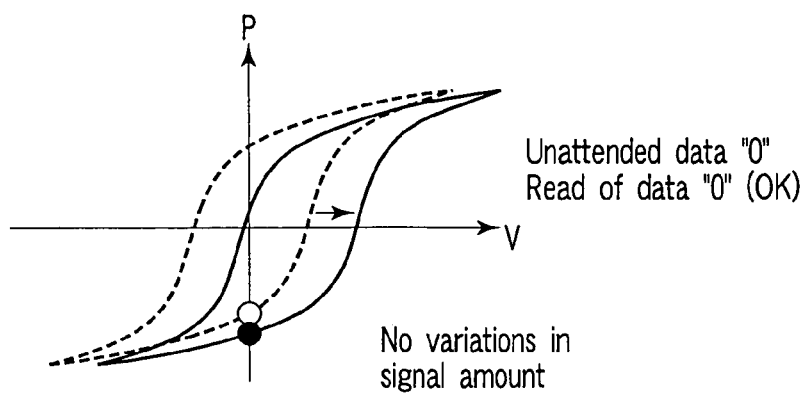
FIG. 17 is a graph illustrating variations of signal amount of an unattended memory cell with data "0" written thereto.
Figure 18:
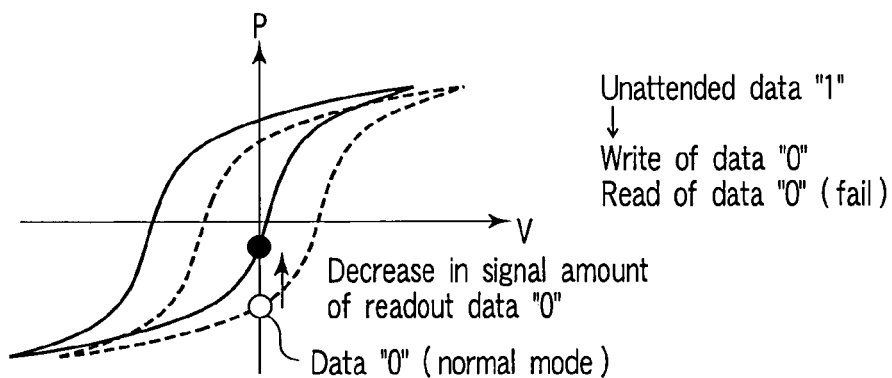
FIG. 18 is a graph illustrating variations of signal amount of an unattended memory cell with data "1" to which data "0" is written.
Figure 19:
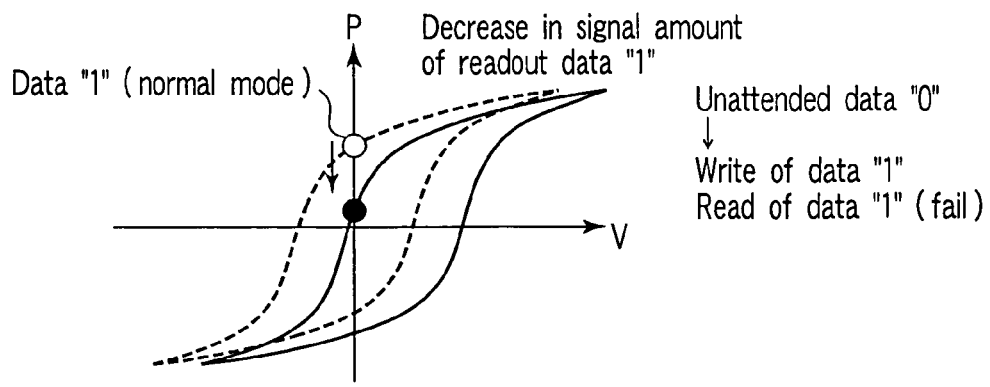
FIG. 19 is a graph illustrating variations of data amount of an unattended memory cell with data "0" to which data "1" is written.
Figure 20:
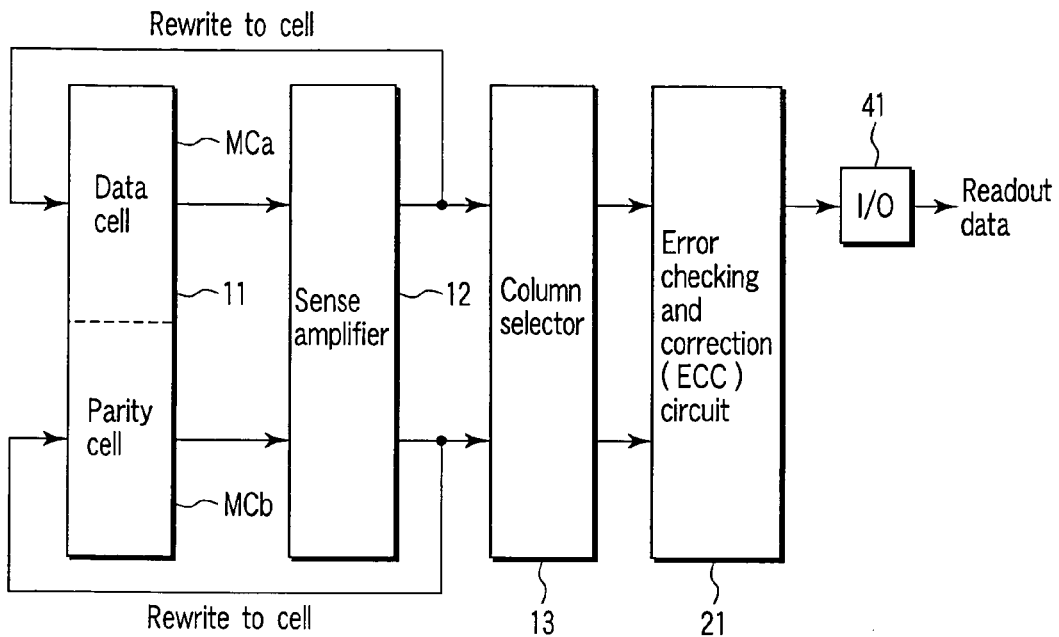
FIG. 20 is a block diagram showing a, basic configuration of a FeRAM according to a first embodiment of the present invention, which adopts an ECC circuit.

FIG. 20 shows a basic configuration of a FeRAM (semiconductor memory device) according to a first embodiment of the present invention. The FeRAM adopts an error checking and correction (referred to as ECC hereinafter) circuit.

As shown in FIG. 20, the FeRAM comprises a memory cell array (or a column block) 11, a sense amplifier 12, a column selector (a column select transistor) 13, an ECC circuit 21 and an input/output (I/O) circuit 41. The memory cell array 11 includes a plurality of memory cells (cell units). Each of the memory cells has a cell transistor (T) and a ferroelectric capacitor (C) that are connected in series.

Generally, a defect in data read caused by the above imprint phenomenon is often a single-bit defect. A method using an ECC circuit is widely known as one for replacing single-bit defective data due to a lapse of time. It is the FeRAM according to the first embodiment that allows data to be read normally using an ECC circuit even though the imprint phenomenon occurs. In a commonly used Humming code system ECC circuit, parity data is provided for each data read unit (word). The parity data has bits to satisfy the condition: $2^p > k+p+1$ where k is data length and p is parity bit length.

The sense amplifier 12 reads cell data and parity data from a data cell Mca and a parity cell MCb in the memory cell array 11 and inputs them to the ECC circuit 21 through the column selector 13. If the cell data has a single-bit error, it is automatically corrected by the ECC circuit 21. The error-corrected cell data is output from the I/O circuit 41. The cell data and parity data that are read out of the memory cell array 11 are rewritten to the data cell MCa and parity cell MCb, respectively by the sense amplifier 12. The FeRAM employing the ECC circuit can thus read data correctly even though the number of memory cells with the imprint phenomenon increases or unattended data is rewritten by data whose remanent polarization P is opposite in direction to that of the unattended data.

Figures 21A, 21B:
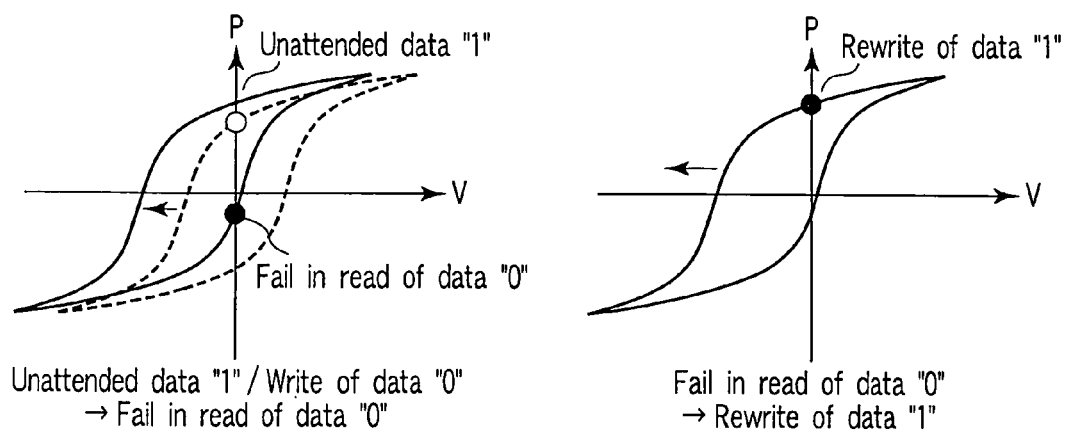
FIGS. 21A and 21B are graphs illustrating a data read operation of the FeRAM shown in FIG. 20.

Assume in the first embodiment that the hysteresis properties of data cell MCa storing data "1" are shifted toward the negative side of the voltage axis (in the direction of arrow) by leaving the data cell MCa unattended as shown in FIG. 21A. If, in this state, data "0" is written to the data cell MCa and then read therefrom, the sense amplifier 12 erroneously outputs data "1" because of a decrease in the remanent polarization of data "0." The data "1" is thus corrected to correct data "0" by the function of the ECC circuit 21 and output from the I/O circuit 41.

In the above case, however, the cell data rewritten to the data call MCa remains data "1." In other words, the rewriting of cell data to the data cell MCa is performed by the output data of the sense amplifier 12, which has not been corrected. Therefore, the cell data rewritten to the data cell MCa results in the same data "1" as the unattended data as shown in FIG. 21B.

Similarly, assume that the hysteresis properties of data cell MCa storing data "0" are shifted toward the positive side of the voltage axis by leaving the data cell MCa unattended. If, in this state, data "1" is written to the data cell MCa and then read therefrom, the sense amplifier 12 erroneously outputs data "0" because of a decrease in the remanent polarization of data "1." The data "0" is thus corrected to correct data "1" by the function of the ECC circuit 21 and output from the I/O circuit 41. In this case, however, the cell data rewritten to the data call MCa remains data "0."

Figure 22A:
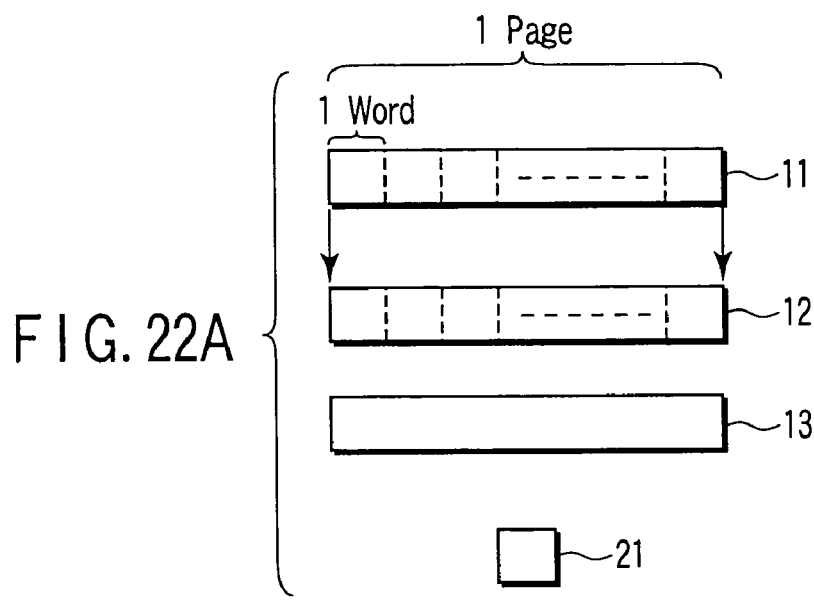
FIGS. 22A to 22C are graphs illustrating a data read operation for each page in the FeRAM shown in FIG. 20.
Figure 22B:
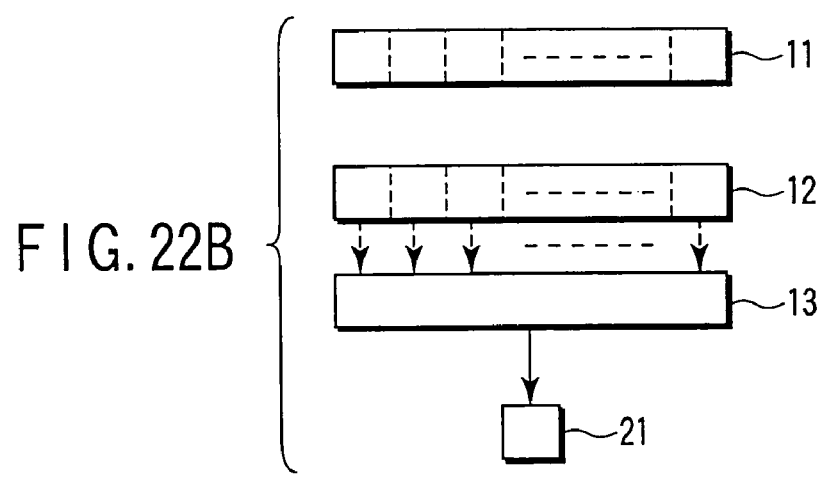
Figure 22C:
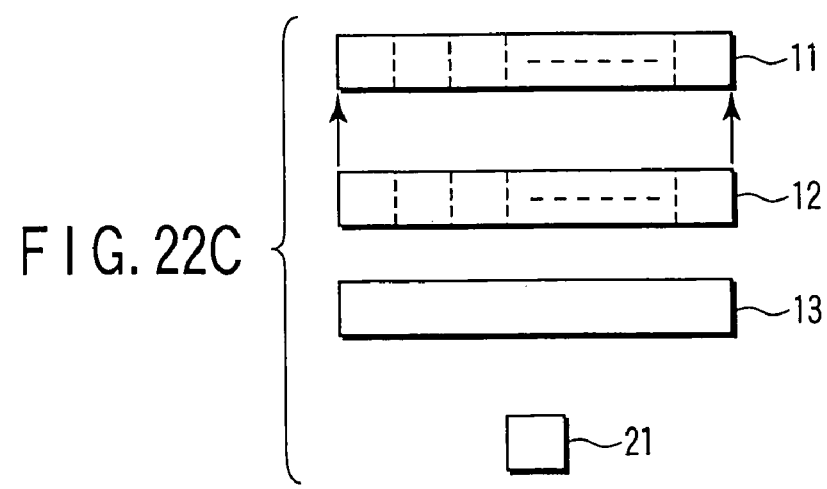

Since the foregoing FeRAM requires an operation of rewriting data in read operation, a data read cycle is lengthened. To avoid this, the following measures are taken. In the FeRAM, the sense amplifier 12 reads data of one page including a plurality of words and holds the data of one page in its internal latch circuits (see FIG. 22A). Then, the column selector 13 reads arbitrary data from the latch circuits for each of the words and outputs it to the ECC circuit 21 (see FIG. 22B). After the column selector 13 completes reading the data of one page, it rewrites data of one page to each data cell MCa (see FIG. 22C). The data read cycle can thus be shortened by the above measures (a so-called page read function).

[Second Embodiment]

FIG. 23 shows a configuration of a FeRAM (semiconductor memory device) according to a second embodiment of the present invention. In the second embodiment, the FeRAM is configured by memory cell arrays (or column blocks) each including a plurality of memory cells (cell units) each having a cell transistor (T) and a ferroelectric capacitor (C) that are connected in series.

The FeRAM comprises a plurality of memory cell arrays (memory cell sections) 11, an ECC circuit 21, a parity generation circuit (generation circuit) 31, an input/output (I/O) circuit 41 and a plurality of DQ controllers 51.

In the FeRAM, each of the memory cell arrays 11 includes a plurality of memory cells MC, a sense amplifier 12 and column select transistors (column selectors) 13a and 13b. A pair of bit lines BL and /BL that are complementary signal lines is connected to the sense amplifier 12. The bit line BL is connected to a data line DQ<i> via the column select transistor 13a, and the bit line /BL is connected to a data line /DQ<i> via the column select transistor 13b. The ECC circuit 21, parity generation circuit 31 and I/O circuit 41 are connected to the data lines DQ<i> and /DQ<i> via each of the DQ controllers 51. One of column select signal lines CSL (0, 1, . . . , j) is connected to the gates of the column select transistors 13a and 13b.

Each of the memory cells MC includes one cell transistor T and one ferroelectric capacitor C connected in series to the cell transistor T. One electrode (lower electrode) of the ferroelectric capacitor C is connected to any one of plate lines PL0, PL1, . . . , PLn, and the other electrode (upper electrode) thereof is connected to the bit line BL or /BL through the cell transistor T. Word lines WL0, WL1, . . . , WLm are connected to the gates of the cell transistor T.

Some of the memory cells MC are data cells MCa for storing cell data. Some of the memory cells MC excluding the data cells MCa are parity cells MCb for storing parity data. The parity data is added for each read operation (word) and has a bit length to satisfy the condition $2^{p>k+p+1}$, where k is data length and p is parity bit length). The sense amplifier 12 includes a plurality of latch circuits (not shown) for holding cell data and parity data in units of pages each having a given number of words.

Figure 24:
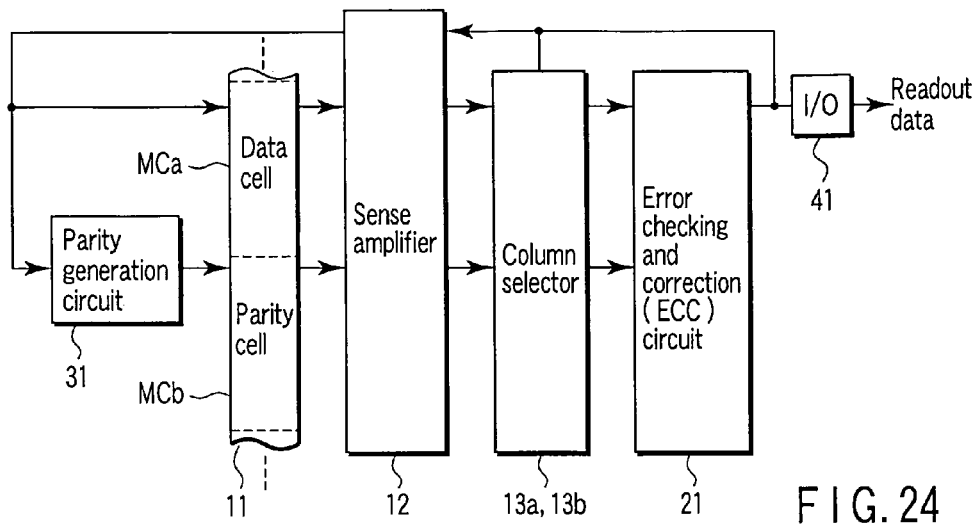
FIG. 24 is a block diagram of a basic configuration of the FeRAM shown in FIG. 23.

FIG. 24 illustrates a data read operation of the FeRAM described above. The FeRAM is so configured that cell data corrected by the ECC circuit 21 is rewritten to a data cell MCa in read operation. Based on the corrected cell data, parity data generated by the parity generation circuit 13 is rewritten to a parity cell MCb. Data that is erroneously read from a memory cell MC with the imprint phenomenon due to a decrease in remanent polarization can thus be corrected automatically. Concurrently with this, the hysteresis properties shifted by the imprint phenomenon can be neutralized.

Figure 25A:
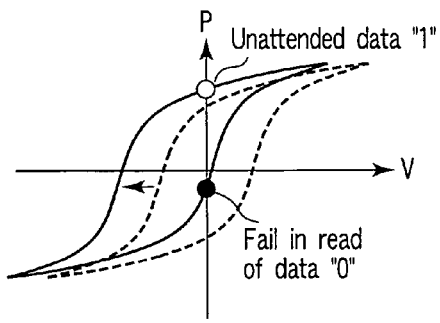
FIGS. 25A to 25C are graphs illustrating a data read operation of the FeRAM shown in FIG. 23.
Figure 25B:
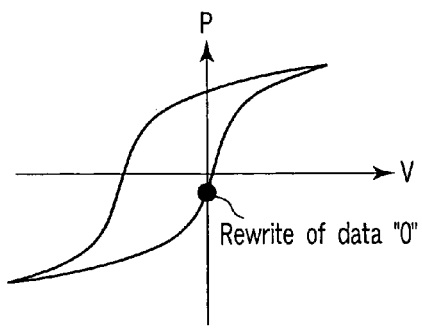
Figure 25C:
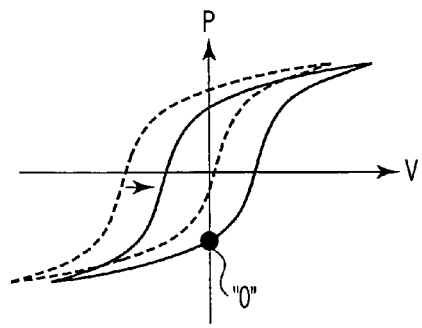

Assume that data "0" written to a data cell MCa with the imprint phenomenon is erroneously read out as data "1" (see FIG. 25A). The rewriting of data to the data cell MCa is performed by data "0" corrected by the ECC circuit 21 (see FIG. 25B). In other words, data is rewritten to the data cell MCa by data "0" whose remanent polarization P is opposite in direction to that of unattended data (data "1"). If, therefore, the data cell MCa with data "0" written thereto continues to be left unattended, the hysteresis properties shifted once toward the negative side of the voltage axis by the imprint phenomenon (unattended data "1") are shifted toward the positive side thereof (in the opposite direction) by the imprint phenomenon (unattended data "0") as shown in FIG. 25C. The hysteresis properties can thus be neutralized.

Similarly, when data "1" written to a data cell MCa with the imprint phenomenon (unattended data "0") is read out, data is rewritten to the data cell MCa by data "1" corrected by the ECC circuit 21. Thus, the hysteresis properties shifted toward the positive side of the voltage axis by the imprint phenomenon (unattended data "0") are shifted toward the negative side thereof (in the opposite direction) by the imprint phenomenon (unattended data "1"). The hysteresis properties can thus be neutralized. As described above, the hysteresis properties are shifted in the opposite direction to suppress the progress of the imprint phenomenon.

The data read operation of the FeRAM will be described further. Assume here that the read cycle can be shortened by the page read function described above.

Figure 26A:
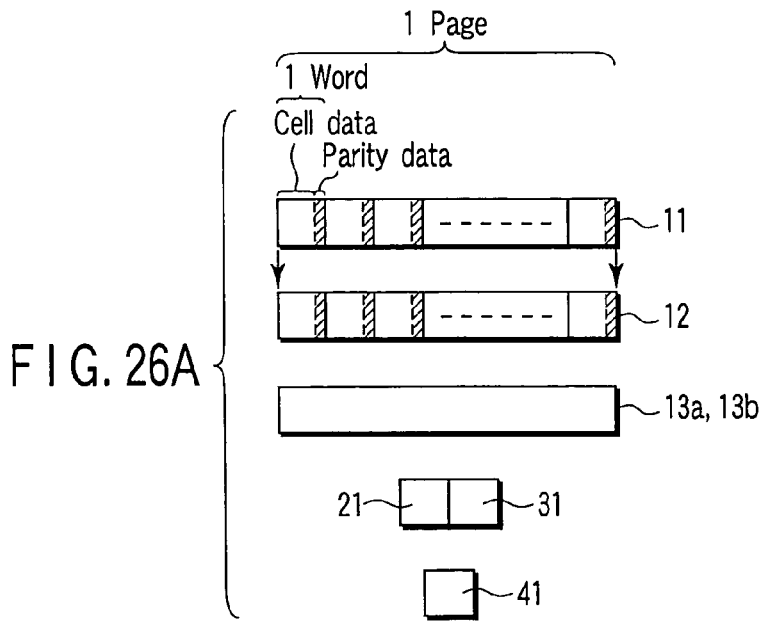
FIGS. 26A to 26C are graphs illustrating a data read operation of the FeRAM shown in FIG. 23.
Figure 26B:
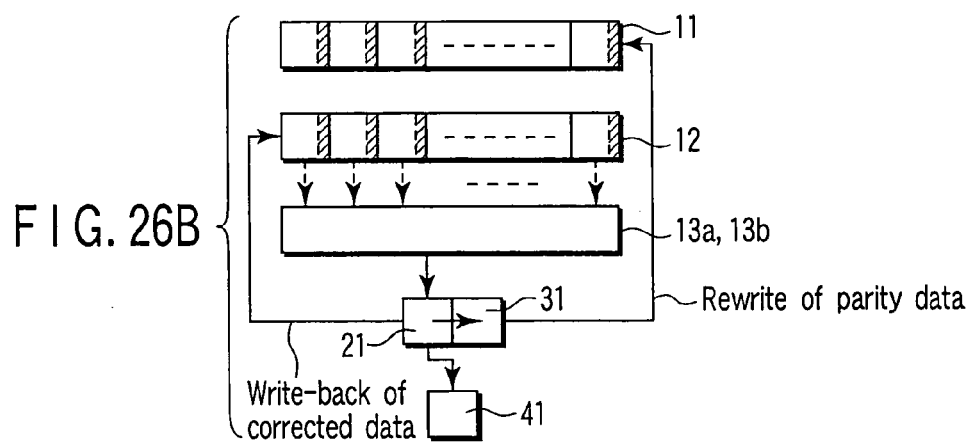

In the FeRAM, as shown in FIG. 26A, the sense amplifier 12 reads cell data of one page including a given number of words and parity data added for each of the words from a given data cell MCa and parity cell MCb, respectively. Then, the sense amplifier 12 holds the cell data and parity data in its internal latch circuits. After that, as shown in FIG. 26B, the column selectors 13a and 13b read arbitrary cell data and parity data from the latch circuits for each of the words and output them to the ECC circuit 21. The ECC circuit 21 corrects an error of the cell data for each of the words in accordance with the parity data and outputs the corrected data to the I/O circuit 41. Then, the corrected cell data is written back to the latch circuits in the sense amplifier 12 for each of the words. Based on the corrected cell data, the parity generation circuit 31 regenerates parity data and rewrites it to a given parity cell MCb.

Figure 26C:
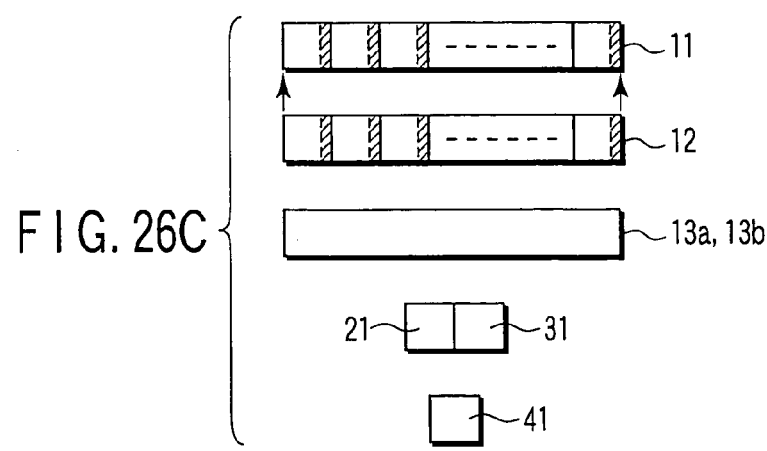

Assume that the above operation is repeated to complete correcting cell data for each of words in one page. The sense amplifier 12 rewrites cell data of one page, which includes corrected data rewritten to each of the latch circuits, to a given data cell MCa in units of pages, as shown in, for example, FIG. 26C. Thus, the read cycle can be shortened, data can correctly be read with respect to an accessed word, and the hysteresis properties shifted by the imprint phenomenon can be neutralized.

[Third Embodiment]

Figure 27:
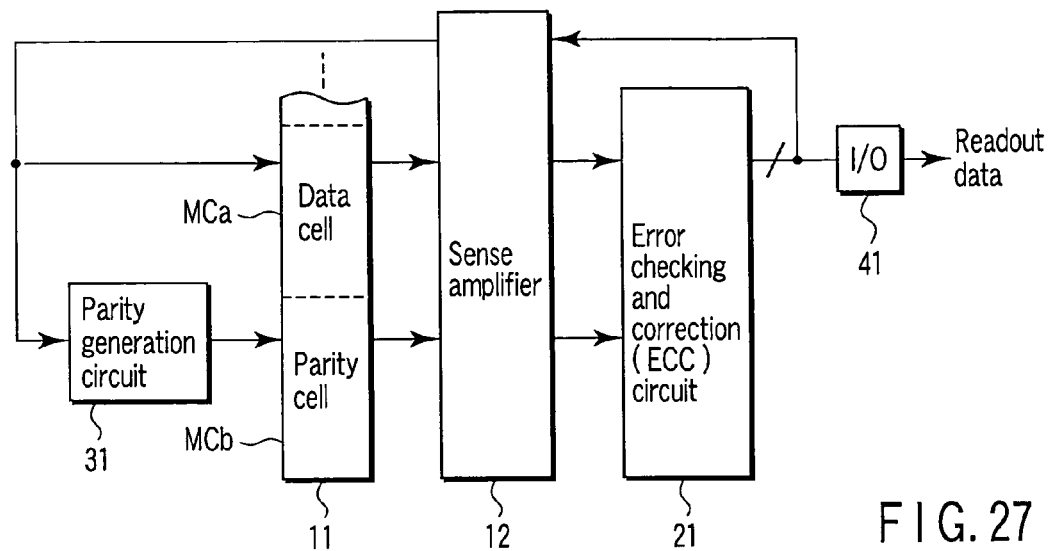
FIG. 27 is a block diagram of a basic configuration of a FeRAM according to a third embodiment of the present invention.

FIG. 27 shows a basic configuration of a FeRAM (a semiconductor memory device) according to a third embodiment of the present invention. In the third embodiment, the number of I/O circuits 41 is set equal to the length of pages for each of which data is read, as is the number of data lines DQ<i> and /DQ<i> (bus width). Parity data is added for each of the pages.

The FeRAM is so configured that the ECC circuit 21 corrects cell data of one page, which is read in units of pages, at once in read operation and then outputs the corrected cell data to the I/O circuit 41. The corrected cell data is rewritten to a data cell MCa and, based on the corrected cell data, parity data generated by the parity generation circuit 31 again is rewritten to a parity cell MCb.

As in the second embodiment described above, data that is erroneously read out of a memory cell with the imprint phenomenon due to a decrease in remanent polarization can automatically be corrected to correct data, and the hysteresis properties shifted by the imprint phenomenon can be neutralized. Further, a higher-speed operation can be performed in the word-to-word read cycle as in the second embodiment (the read cycle can be shortened) because cell data need not be corrected or parity data need not be generated. Since data of one page is corrected at once, cell data that is most likely to cause the imprint phenomenon within one page can be corrected with reliability. It is thus possible to resolve the following problem as in the second embodiment. A word not accessed in data of one page is not corrected by the ECC circuit 21 or the hysteresis properties cannot be neutralized though they are shifted by the imprint phenomenon.

Figure 28A:
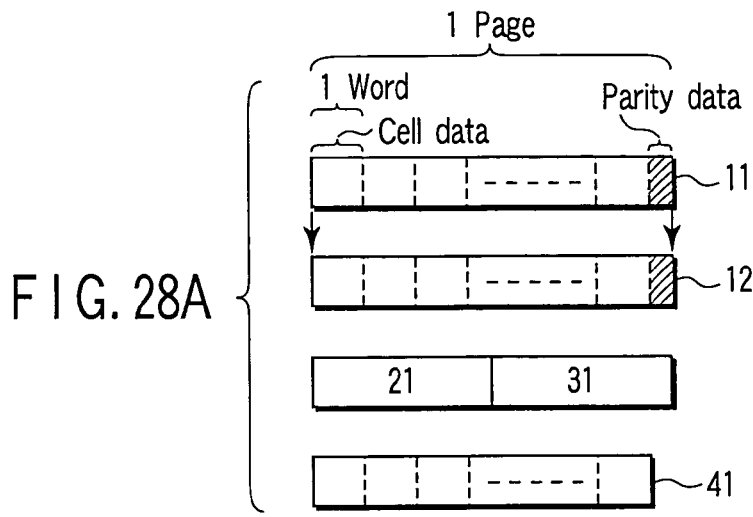
FIGS. 28A to 28C are graphs illustrating a data read operation of the FeRAM shown in FIG. 27.
Figure 28B:
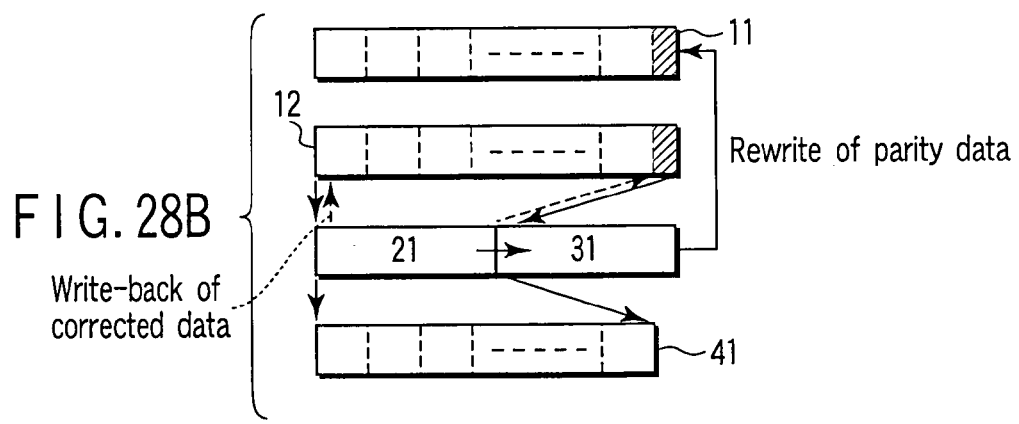

The data read operation of the FeRAM according to the third embodiment will be described further. As illustrated in FIG. 28A, the sense amplifier 12 reads cell data of one page including a given number of words and parity data added for each page from a given data cell MCa and parity cell MCb. Then, the sense amplifier 12 holds the cell data and parity data in its internal latch circuits. After that, as shown in FIG. 28B, the cell data and parity data are read out of the latch circuits at once and output to the ECC circuit 21. The ECC circuit 21 corrects errors of the cell data of one page at once in accordance with the parity data and outputs the corrected data to the I/O circuit 41. The corrected cell data is rewritten to the latch circuits in the sense amplifier 12. Based on the corrected cell data, the parity generation circuit 31 regenerates parity data and rewrites the regenerated parity data to a parity cell MCb.

Figure 28C:
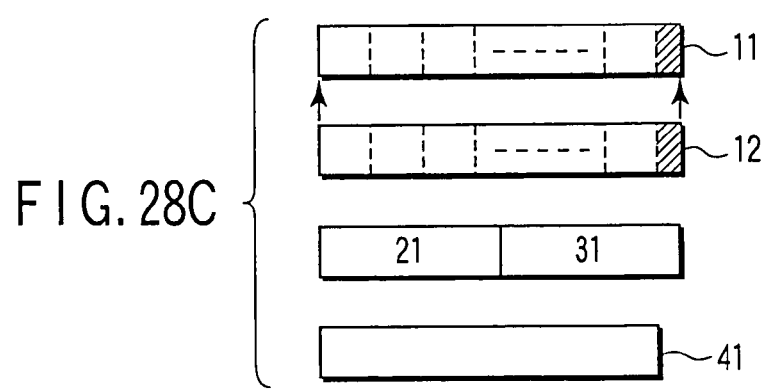

The corrected data of one page, which is written back to each of the latch circuits, is rewritten to a given data cell MCa in units of pages by the sense amplifier 12, as shown in FIG. 28C. Thus, the read cycle can be shortened and the hysteresis properties shifted by the imprint phenomenon can be neutralized for all the words, while data can be read correctly. Moreover, data of the parity cell MCb is rewritten by the parity data regenerated by the parity generation circuit 31, based on the corrected data. Consequently, the ECC circuit 21 can always detect and correct an error using the regenerated parity data.

In the third embodiment, for example, a selector for selecting a word from I/O output data of one page can be provided to selectively read only cell data necessary for each word.

[Fourth Embodiment]

Figure 29:
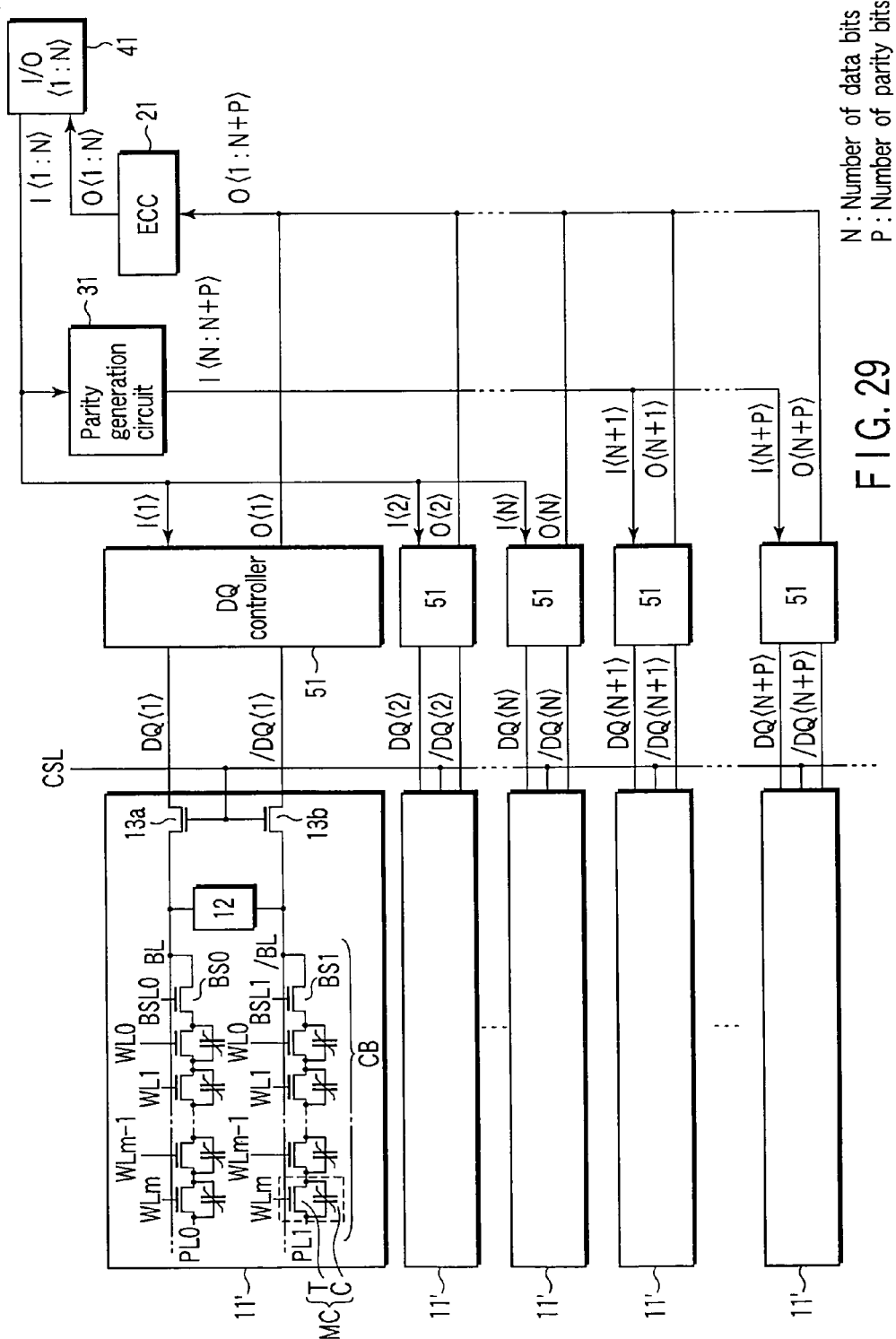
FIG. 29 is a block diagram of a configuration of a FeRAM according to a fourth embodiment of the present invention.

FIG. 29 shows a configuration of a FeRAM (semiconductor memory device) according to a fourth embodiment of the present invention. The fourth embodiment will be described taking a TC parallel unit series-connected FeRAM as an example.

The TC parallel unit series-connected FeRAM comprises a plurality of memory cell arrays (or column blocks) 11', an ECC circuit 21, a parity generation circuit (generation circuit) 31, an input/output (I/O) circuit 41 and a plurality of DQ controllers 51, as shown in FIG. 29.

Each of the memory cell arrays 11' includes a plurality of memory cells MC, a plurality of block selection transistors BS (0, 1, . . . , k), a sense amplifier 12 and column select transistors (column selectors) 13a and 13b. A pair of bit lines BL and /BL that are complementary signal lines is connected to the sense amplifier 12. The bit line BL is connected to a data line DQ<i> via the column select transistor 13a, and the bit line /BL is connected to a data line /DQ<i> via the column select transistor 13b. The ECC circuit 21, parity generation circuit 31 and I/O circuit 41 are connected to the data lines DQ<i> and /DQ<i> via each of the DQ controllers 51. One of column select signal lines CSL (0, 1, . . . , j) is connected to the gates of the column select transistors 13a and 13b.

Each of the memory cells MC has one transistor T and one ferroelectric capacitor C connected in parallel between the source and drain of the cell transistor T. Word lines WL0, WL1, . . . , WLm are connected to the gates of cell transistors T. The memory cells MC are divided into a plurality of cell blocks CB each having a given number of memory cells MC connected in series. One end of each of the cell blocks CB is connected to a plate line PL (one of PL0 and PL1), and the other end is connected to one of the bit lines BL and /BL through the block selection transistor BS (one of BS0 and BS1). The block select signal line BSL (one of BSL0 and BSL1) is connected to the corresponding gate of the block selection transistor BS.

In the FeRAM according to the fourth embodiment, too, some of the memory cells MC are data cells MCa for storing cell data. Another memory cells MC are parity cells MCb for storing parity data (bit length $2^{p>k+p+1}$) that is added for each read unit (word) or each page.

As in the second embodiment, data written to a cell with the imprint phenomenon can correctly be read out and the hysteresis properties shifted by the imprint phenomenon can be neutralized without sacrificing a read cycle. In the fourth embodiment, therefore, not only data of a cell with the imprint phenomenon can correctly be read out, but also the imprint phenomenon can be inhibited from progressing.

The TC parallel unit series-connected FeRAM is not limited to the second embodiment but can be applied to the first or third embodiment. In each of the embodiments, the ECC circuit is provided not only common to the memory cell arrays but also for each of the memory cell arrays.

[Fifth Embodiment]

Figure 30:
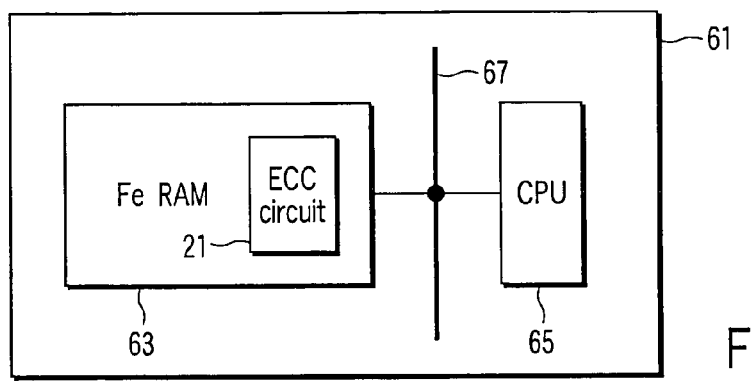
FIG. 30 is a block diagram of a FeRAM-embedded LSI according to a fifth embodiment of the present invention.

FIG. 30 shows a basic configuration of a FeRAM-embedded LSI (semiconductor device) according to a fifth embodiment of the present invention. The FeRAM-embedded LSI will be described taking an integrated circuit card (referred to as an IC card hereinafter) as an example.

In the IC card, for example, a FeRAM chip 63 and a central processing unit (CPU) chip 65 are mounted on a card substrate 61. These chips 63 and 65 are connected to each other via a system bus (control bus) 67.

Figure 31:
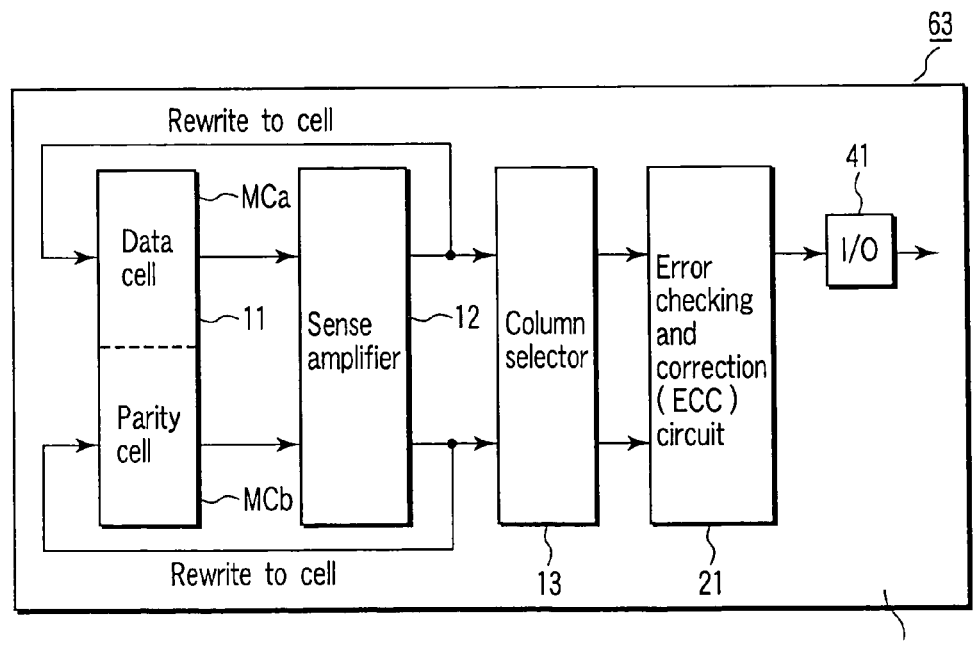
FIG. 31 is a block diagram of a basic configuration of a FeRAM mounted on the FeRAM-embedded LSI shown in FIG. 30.

FIG. 31 shows a configuration of the FeRAM chip 63. In the fifth embodiment, the FeRAM chip 63 is formed into one chip. In other words, the FeRAM chip 63 is so configured by mounting a FeRAM (semiconductor memory device) adopting the ECC circuit 21 shown in FIG. 20 on a single substrate 70.

It is thus possible to achieve an IC card capable of correctly reading data from a memory cell MCa with the imprint phenomenon.

Figure 32:
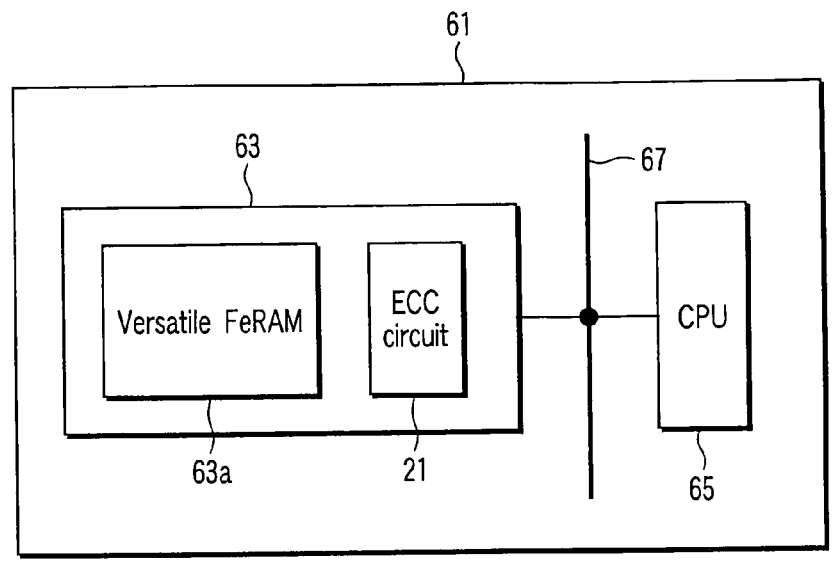
FIG. 32 is a block diagram showing another FeRAM-embedded LSI.
Figure 33:
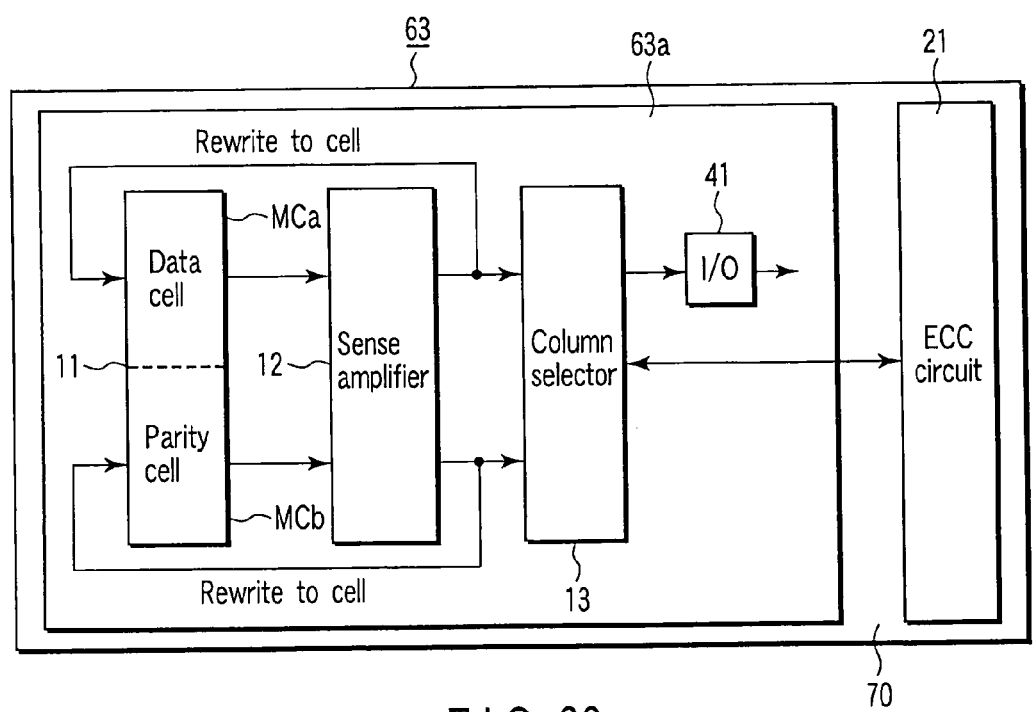
FIG. 33 is a block diagram of a basic configuration of a FeRAM mounted on the FeRAM-embedded LSI shown in FIG. 32.

The FeRAM chip 63 can be formed by mounting a versatile FeRAM 63a not adopting an ECC circuit and an ECC circuit 21 on the single substrate 70, as shown in FIGS. 32 and 33.

The fifth embodiment has been described taking the FeRAM adopting the ECC circuit 21 in the first embodiment as an example. However, the fifth embodiment is not limited to this, but can be applied to the FeRAMs according to the second, third and fourth embodiments.

The fifth embodiment can also be applied to various FeRAM-embedded LSIs as well as the IC card described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   at least one memory cell section having a plurality of memory cells each using a cell transistor and a ferroelectric capacitor to store data, a sense amplifier being connected to the memory cells through a bit line; and
   an error checking and correction circuit which checks and corrects an error of arbitrary cell data, which is read out of the memory cells by the sense amplifier, through the bit line in accordance with parity data,
   wherein the sense amplifier rewrites the cell data, the error of which is corrected by the error checking and correction circuit, to the memory cells in read operation.

2. The semiconductor memory device according to claim 1, wherein the sense amplifier has a plurality of latch circuits to latch the cell data and the parity data in units of pages.

3. The semiconductor memory device according to claim 1, wherein the memory cells to which the cell data whose error has been corrected is rewritten is left unattended with first cell data rewritten thereto, and second cell data is written to the memory cells while hysteresis properties of the memory cells are shifted, the second cell data having a remanent polarization whose direction is opposite to that of a remanent polarization of the first cell data.

4. The semiconductor memory device according to claim 1, wherein the memory cells are arranged in array, and the cell transistor of each of the memory cells has gate, source and drain terminals,
   a word line being connected to the gate terminal, one electrode of the ferroelectric capacitor being connected to one of the source and drain terminals, the bit line being connected to other of the source and drain terminals, and a plate line being connected to another electrode of the ferroelectric capacitor.

5. The semiconductor memory device according to claim 1, wherein the memory cells are arranged in array,
   the cell transistor of each of the memory cells has a gate terminal connected to a word line and source and drain terminals between which the ferroelectric capacitor is connected,
   the memory cells are connected in series to form at least one memory cell block, and
   one end of the memory cell block is connected to the bit line through a block selection transistor, and other end of the memory cell block is connected to a plate line.

6. The semiconductor memory device according to claim 1, wherein the error checking and correction circuit checks and corrects an error of arbitrary cell data read for each word, the arbitrary cell data being included in cell data read in units of pages.

7. The semiconductor memory device according to claim 1, wherein the parity data is read out of a given memory cell of the memory cell section for each word by the sense amplifier and used for error checking and correction, and the device further comprises a generation circuit which regenerates the parity data based on the cell data whose error has been corrected and rewrites the regenerated parity data to the given memory cell.

8. The semiconductor memory device according to claim 7, wherein the parity data is provided for each word that is one unit of data readout.

9. The semiconductor memory device according to claim 1, wherein the error checking and correction circuit checks and corrects errors of a plurality of items of cell data at once for each page, the items of cell data being read out in units of pages.

10. The semiconductor memory device according to claim 1, wherein the parity data is read out of a given memory cell of the memory cell section for each page by the sense amplifier and used for error checking and correction, and the device further comprises a generation circuit which regenerates the parity data based on the cell data whose error has been corrected and rewrites the regenerated parity data to the given memory cell.

11. The semiconductor memory device according to claim 10, wherein the parity data is provided for each page that is one unit of data readout.

12. The semiconductor memory device according to claim 1, wherein the memory cell section and the error checking and correction circuit are provided on a single substrate.

13. A semiconductor device comprising:
a substrate on which a semiconductor memory device is mounted;
a memory cell section provided on the substrate and configuring the semiconductor memory device, the memory cell section including at least one memory cell having a cell transistor and a ferroelectric capacitor to store data, a sense amplifier being connected to the memory cell through a bit line;
an error checking and correction circuit provided on the substrate and configuring the semiconductor memory device, the error checking and correction circuit checking and correcting an error of cell data read out of the one memory cell by the sense amplifier, through the bit line; and
a control circuit which controls the semiconductor memory device.

14. The semiconductor device according to claim 13, wherein the sense amplifier rewrites the cell data, which is read out of the memory cell, to the memory cell in read operation.

15. The semiconductor device according to claim 13, wherein in read operation, the sense amplifier rewrites the cell data whose error has been corrected by the error checking and correction circuit to a memory cell from which cell data whose error has not been corrected.

16. The semiconductor device according to claim 13, further comprising a generation circuit which regenerates parity data used for error checking and correction in the error checking and correction circuit, based on the cell data whose error has been corrected.

* * * * *